(12) United States Patent
Johnston

(10) Patent No.: US 8,103,008 B2
(45) Date of Patent: Jan. 24, 2012

(54) LOUDNESS-BASED COMPENSATION FOR BACKGROUND NOISE

(75) Inventor: James D. Johnston, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 1283 days.

(21) Appl. No.: 11/740,776

(22) Filed: Apr. 26, 2007

(65) Prior Publication Data

US 2008/0267427 A1 Oct. 30, 2008

(51) Int. Cl.
*H03G 3/20* (2006.01)
*H03G 9/00* (2006.01)

(52) U.S. Cl. ......... 381/57; 381/102; 381/107; 381/94.7; 704/233

(58) Field of Classification Search .......... 381/56, 381/57, 73.1, 98, 101, 102, 104, 106, 107, 381/80, 94.1–94.3, 94.7; 704/233, 226
See application file for complete search history.

(56) References Cited

U.S. PATENT DOCUMENTS

| | | | |
|---|---|---|---|
| 4,868,881 A | | 9/1989 | Zwicker et al. |
| 5,107,539 A | * | 4/1992 | Kato et al. ........... 381/57 |
| 5,450,494 A | | 9/1995 | Okubo et al. |
| 5,615,270 A | | 3/1997 | Miller et al. |
| 5,666,426 A | * | 9/1997 | Helms ............. 381/57 |
| 7,035,796 B1 | | 4/2006 | Zhang et al. |
| 7,058,188 B1 | | 6/2006 | Allred |
| 7,840,012 B2 | * | 11/2010 | De Poortere .......... 381/57 |
| 2002/0191804 A1 | | 12/2002 | Luo et al. |
| 2005/0013443 A1 | | 1/2005 | Marumoto et al. |
| 2007/0053528 A1 | * | 3/2007 | Kim et al. ............. 381/107 |

FOREIGN PATENT DOCUMENTS

GB   2 238 680 A   6/1991
WO   WO 2006/047600 A1   5/2006

OTHER PUBLICATIONS

De Pērez et al., "Noise Reduction and Loudness Compression in a Wavelet Modelling of the Auditory System," *Devices, Circuits and Systems*, Proceedings 2000 IEEE, Mar. 2000, 6 pages.
Gan et al., "Adaptive Noise Equalizer with Equal-Loudness Compensation," *Circuits and Systems*, ISCAS 2005 IEEE International Symposium, May 2005, pp. 276-279.
Ozawa et al., "Compensation Methods of Sound Quality for a Car-Audio Equalizer," *Networking, Sensing and Control*, Proceedings 2005 IEEE, Mar. 2005, pp. 311-316.

* cited by examiner

*Primary Examiner* — Xu Mei
(74) *Attorney, Agent, or Firm* — Klarquist Sparkman, LLP

(57) ABSTRACT

Loudness-based compensation systems and techniques are described which provide audio compensation in noisy environments. Loudness approximations are determined for an audio block both by itself and in the presence of background noise. These approximations utilize compression of audio intensity within frequency bands in order to better reflect listeners' hearing perception. From these loudness approximations, a gain is determined for the audio block and then applied in such a manner that the effect is not jarring to listeners.

23 Claims, 9 Drawing Sheets

LOUDNESS-BASED COMPENSATION FOR BACKGROUND NOISE

BACKGROUND

As audio and video compression technology improves and player capacity rises, digital playback equipment is approaching ubiquity in everyday life. Portable digital music players, such at the Microsoft Zune player, can now be found everywhere. Additionally, listeners utilize car and home stereo systems when not listening to portable players.

Each of these listening environments is susceptible to noise from outside the playback system. Background noise, such as extraneous conversation, traffic noise, construction noise, or road or air travel noise, can make listening to music on a player or system difficult, if not impossible. And while a user can attempt to compensate for noise using his or her volume control, such an active solution is unpalatable to many, who would prefer their listening or viewing experience be more passive.

Existing techniques attempt to address these issues by providing automatic, finer-grained amplification (or "gain") which changes to compensate for background noise, in order that a listener/viewer may enjoy his or her media consistently without being required to adjust the volume him or herself.

However, many existing volume compensation techniques suffer from inaccurate or overly-complex models of compensation to be particularly effective. In one example, existing techniques perform compensation based on comparisons of the amount of energy or intensity in the played signal to the energy contained in the background noise against which the compensation is to be performed. These techniques, while easy to implement, are unfortunately not optimal from a listener's perspective. In particular, these intensity-based techniques ignore essential inconsistencies in the way the human ear perceives additional sounds. For example, research has shown that two pitches of a given energy will sound louder to a listener if they are farther apart in frequency than if they are closer together. Existing compensation techniques and systems which rely solely on measures of energy cannot recognize a difference in these scenarios, however, and will therefore exhibit unpredictable and annoying results to a listener.

At the other end of the spectrum from these energy-based techniques are certain techniques which attempt to model the human hearing mechanism at a very high level of precision in order to provide for proper compensation. These techniques, while more cognizant of how increased volume is perceived by a listener, oftentimes rely on overly-complex breakdowns of audio, as well as utilize multiple perceptual models. What results is a great deal of calculation for each block of audio for which compensation is applied, in an effort to measure and exactly correct for numerous background sounds. This is undesirable as such an amount of calculation may be undesirable for existing players; extraneous computation can slow down responsiveness of playback equipment and can also unnecessarily lower battery life. Additionally, various existing techniques attempt to provide compensation at a very low granularity level, such that different levels of gain are applied for different frequencies of an audio signal. In addition to again requiring more computation than may be desired, such systems and techniques can result in compensated-for audio that may sound strange to a listener.

What is needed is a system for providing efficient compensation for background and other extraneous noise during playback, but which does not require overly-complex computation.

SUMMARY

Loudness-based compensation system and techniques are described which provide audio compensation in noisy environments. In one example, these techniques determine loudness approximations for an audio block, both by itself and in the presence of background noise. In an exemplary process, these approximations compress audio intensity within frequency bands and sum audio intensity across bands based on models of listeners' hearing perception. In an exemplary process, a gain is determined from loudness approximations for the audio block and then limited in such a manner that the effect is less jarring to a listener.

A method of adjusting an audio signal comprising multiple frequency bands to improve perception of the signal in the presence of a sound other than the audio signal is described. The method comprises performing a first loudness approximation on a plurality of frequency bands of the audio signal, resulting in a first combined loudness measurement, performing a second loudness approximation on the plurality of frequency bands of the audio signal in the presence of the sound other than the audio signal, resulting in a second combined loudness approximation measurement, applying gain to the audio signal based on a comparison of the first and second combined loudness measurements, and playing the modified audio signal.

A method of reducing perception of background noise when playing an audio signal is described, comprising analyzing a block of samples from a plurality of frequency bands of the audio signal to determine a combined loudness parameter for the block of samples without the background noise and analyzing the block of samples from a plurality of frequency bands of the audio signal along with samples from the same frequency bands of the background noise to determine a combined loudness parameter for the block of samples in the presence of the background noise. The described method also comprises determining a level of gain to apply to the block of samples to correct for reduced perceived loudness of the audio signal in the presence of the background noise and amplifying the block according to the determined level of gain.

Computer-readable media are described which contain instructions which, when executed by a computer cause the computer to perform a method of reducing perception of background noise when playing an audio signal. The method comprises analyzing a block of samples from a plurality of frequency bands of the audio signal to determine a combined loudness measurement for the block of samples without the background noise and analyzing the block of samples from a plurality of frequency bands of the audio signal along with samples from the same frequency bands of the background noise to determine a combined loudness measurement for the block of samples in the presence of the background noise. The method also comprises determining a level of gain to apply to the block of samples to correct for reduced perceived loudness of the audio signal in the presence of the background noise and amplifying the block according to the determined level of gain.

DETAILED DESCRIPTION

The exemplary techniques and systems described herein perform an approximation of the loudness of a signal, as well as the loudness of background noise, in order to determine gain to apply to the signal in order to compensate for the background noise. As used herein "loudness" represents a psychoacoustic measurement of sound; in other words, loudness represents the perceived volume of a sound or sounds. In particular, the techniques and systems approximate loudness by dividing the range of audible sound into multiple frequency bands, and then, within each band, compressing the audio intensity in the band according to a power-law relationship. Loudness is then approximated by summing the compressed bands. In order to determine a compensatory level of gain, loudness approximations are taken in and out of the presence of a background noise, and, typically, a single gain is applied across all bands according to a function of a ratio of the loudnesses.

This technique has many desirable features. By using loudness-based metrics, these techniques provide compensation that is based upon listeners' perceptual realities, rather than relying on measurements of intensity or energy, which are not tuned to a human listener. Additionally, because the techniques perform approximations of loudness and typically apply only a single gain across all frequencies, they are more efficient than existing techniques which require unnecessarily complicated calculations in order to "measure" a loudness metric.

1. Examples of Loudness-Based Compensation Systems

Figure 1:
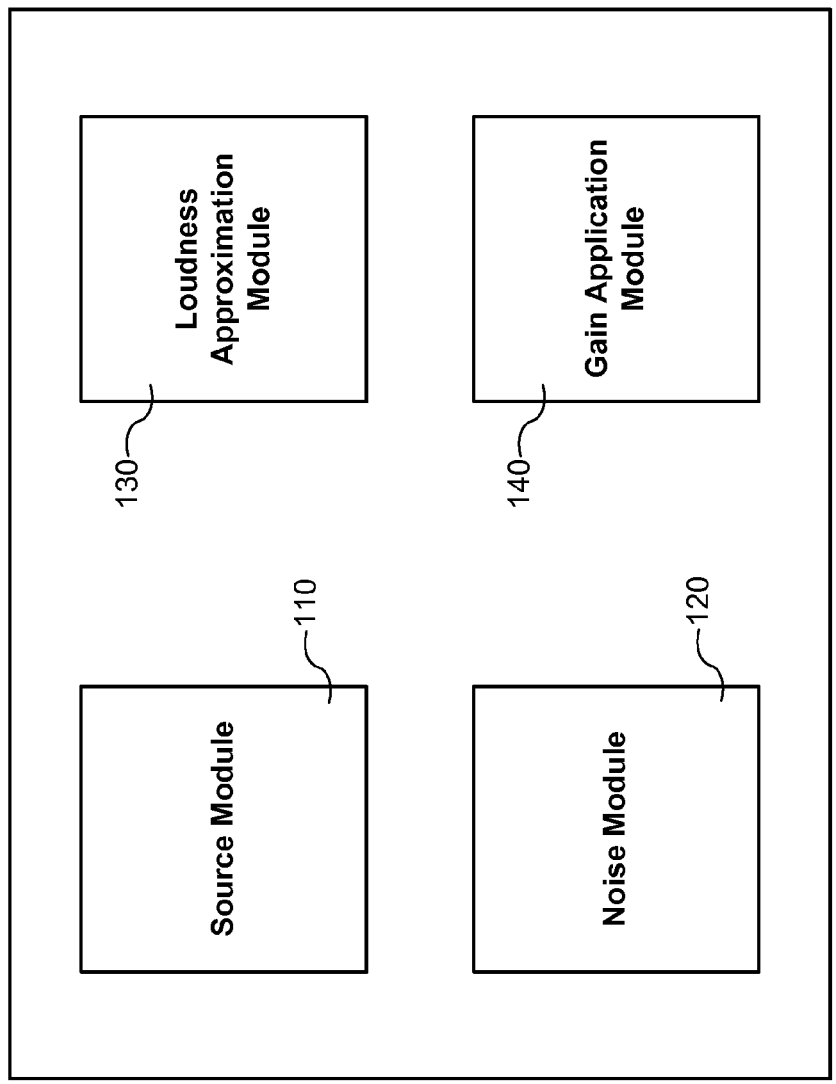
FIG. 1 is a block diagram illustrating an example of a loudness-based compensation system.

FIG. 1 is a block diagram illustrating Loudness-Based Compensation System 100. FIG. 1 illustrates modules 110-140 which perform various processes in the course of performing the compensation described herein. While the modules of FIG. 1 are illustrated separately, in various implementations the modules may be combined or split into more modules; additionally, the modules may represent hardware, software, or a combination thereof. In particular implementations, one or more modules or procedures of the loudness-based compensation system 100 may be performed by software, or by hardware, some examples of which are described herein.

In the illustrated implementation, the compensation system 100 comprises a source module 110. In one implementation, the source module provides an audio signal, or source signal, which is played for a listener (or viewer, in the case that the media is video). In one implementation, the source module comprises a digital media player, such as a CD or DAT player. In another example, the source module is configured to play digital music files. Examples of such files include, but are not limited to files such as mp3, wma, flac, acc, apple lossless, wav, real, or ogg files. In another implementation, the source module is configured to play video files, such as for example, Windows Media, Quicktime, or Real files. In yet another implementation, the source module may be configured to operate with non-digital media or sources, such as magnetic tape or vinyl disks.

In various implementations, the source module may comprise a portable media player, such as a Microsoft Zune or Apple iPod player, or may comprise a stationary player, such as a traditional stereo system. The source module may be configured to play audio through personal audio devices, such as headphones, or through non-individual devices, such as loudspeakers. Additionally, in one implementation, the source module may not comprise pre-recorded media, but instead may comprise a streaming media source, either through radio waves or digital streaming, or a contemporaneous local source, such as an audio source which is recorded at the time of the loudness-based compensation.

Next, the illustrated implementation comprises a noise module 120, which is configured to measure background noise for which compensation is desired. In one implementation, this measurement is performed utilizing a microphone which records (or otherwise takes in) existing background sounds and maintains them sufficiently that they may be analyzed to be used in the loudness-based compensation techniques described herein. In another implementation, background noise is estimated based on the scenario for which compensation is desired. For example, for audio playback in a motor vehicle, background noise may be estimated based on the speed of the vehicle. In another example, for audio transmitted over a noisy line, if the noise present on the line may be estimated, the loudness-based compensation techniques described herein may be utilized to provide compensation at the point of transmission to correct for the noisy line.

The illustrated implementation of the loudness-based compensation system 100 also comprises a loudness approximation module 130, which is configured, in one implementation, to approximate loudness for a given signal. In one implementation, discussed in greater detail below, this module is configured to approximate loudness of a signal by itself and also loudness in the presence of background noise, in order that a level of gain can be calculated to compensate for the presence of the background noise. In various implementations, the processes of the loudness approximation module 130 can be performed by software, hardware, or a combination of the two. Details of particular implementations of loudness approximation are discussed below.

The illustrated implementation of the loudness-based compensation system 100 also comprises a gain application module 140, which is configured, in one implementation, to compute and apply gain to a given signal based on loudness determinations made by the loudness approximation module. In one implementation, discussed in greater detail below, this module is configured to moderate the application of gain over time in order that the change in music intensity isn't jarring or confusing to a listener. In various implementations, the processes of the loudness approximation module 140 can be performed by software, hardware, or a combination of the two. Details of particular implementations of gain application are discussed below.

2. Examples of Loudness-Based Compensation Techniques

Figure 2:
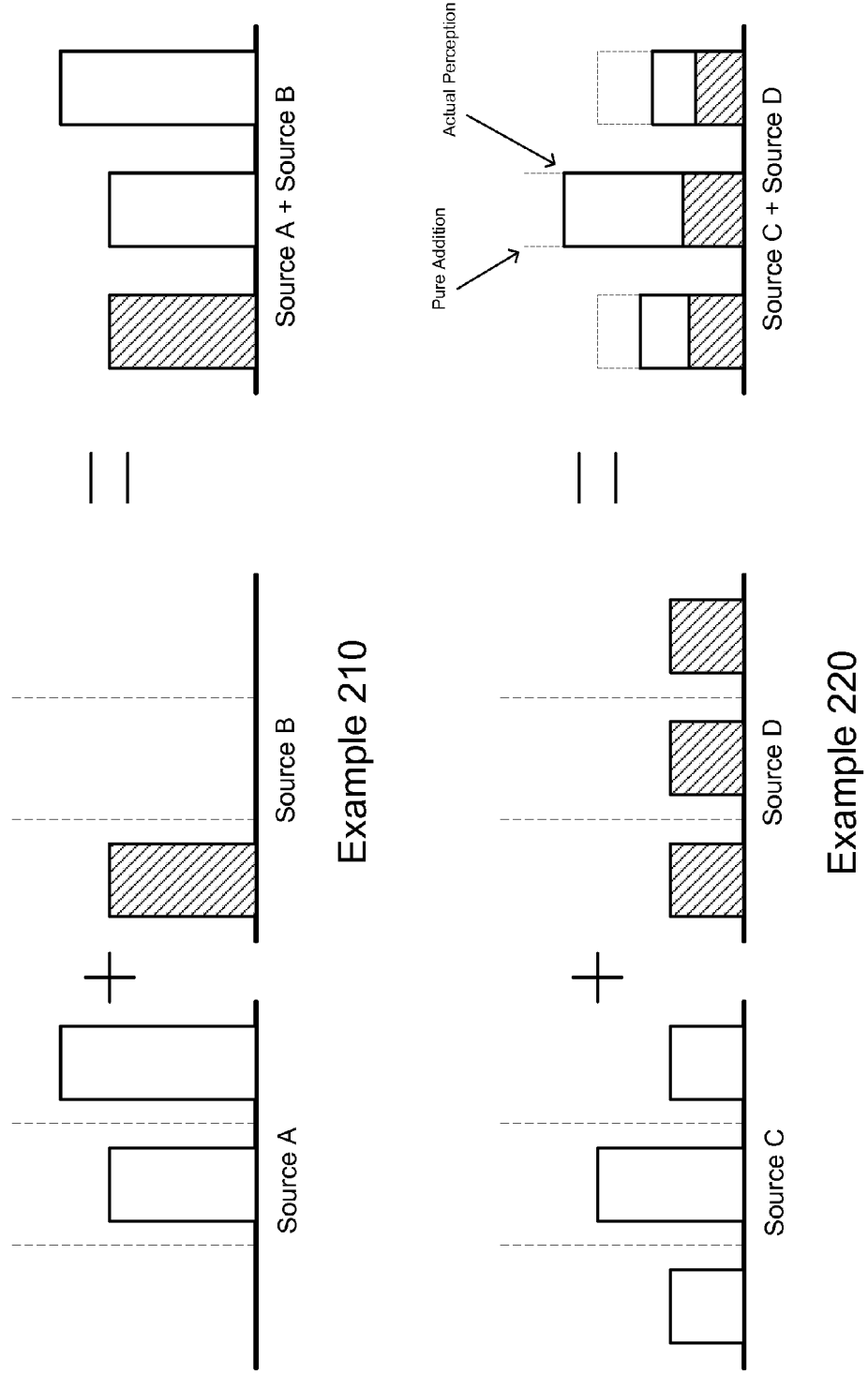
FIG. 2 illustrates examples of addition of sounds, as perceived by a listener.

FIG. 2 is a pair of examples 210 and 220 which illustrate, in a general way, the differences in human perception of sounds upon which the loudness-based approximation techniques and systems described herein are based. It should be noted that, in the examples of FIG. 2, the bars represent only general perceptions of sounds by a human listener and are for illustrative purposes only; these examples are not created with regard to any particular sounds, intensities, or frequencies.

The examples in FIG. 2 illustrate perceived volume for sounds over three representative frequency bands. In both the examples of FIG. 2 and in the loudness-based compensation techniques described herein, the frequency bands are chosen to model typical human loudness perception, as described herein. For the sake of easy comparison, the bars in the examples represent an amount of perceived loudness within a given frequency band.

Example 210 illustrates the perception by a listener of the addition of two sources (Source A and Source B), which do not have sounds in any common frequency bands. In this example, a listener's perception of the combination of the two sources (A and B), is largely additive; a listener will typically hear each band at the same loudness as it would be perceived in it original sound.

Contrasting this is the example illustrated in Example 220. In this example, the Sources C and D have frequency bands in common, and so the perceived combination "Source C+D" will contain an added set of sounds in each frequency band. However, as Example 220 illustrates, the addition of the sounds within each band isn't purely additive. In fact, a listener will perceive the loudness of the two sounds within a given frequency band to be somewhat less than what would be arrived at by a pure addition of the two original sounds. This is illustrated in Example 220 by the dotted lines in the combination graph, which represent what the loudness in each band would be if the combinations were perceived strictly as if combination within bands were additive. Instead, however, Example 220 shows that the perceived sound in each band is less than the "additive" level. In one implementation, this characteristic is referred to as "compression" within a frequency band. It is recognition of this compression characteristic of listener perception that a loudness-based compensation technique takes into account in order to provide a more-accurate compensation model than one that relies entirely on sound intensity.

Figure 3:
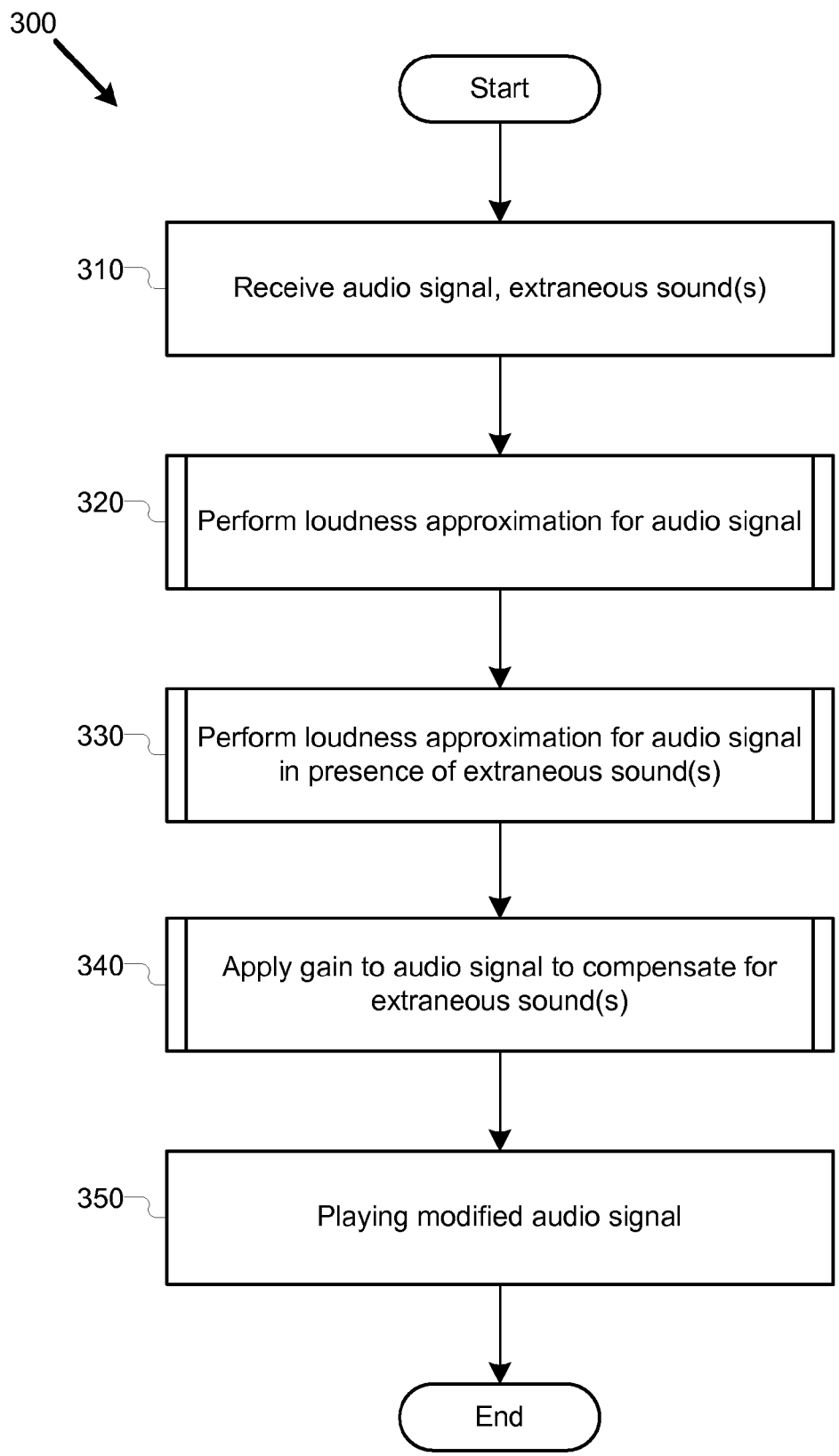
FIG. 3 is a flowchart illustrating an example process performed by the system of FIG. 1 for performing loudness-based compensation.

FIG. 3 is a flowchart of an example process 300 performed by the loudness-based compensation system 100 for performing loudness-based compensation. In various implementations, the illustrated process blocks may be merged, divided into sub-blocks, or omitted. The process begins at block 310, where an audio signal is received by the system, as well as one or more extraneous sound or sounds for which compensation is desired. In one implementation, this reception of sounds is performed by the source module 110 and/or noise module 120 illustrated in FIG. 1. As mentioned above, in various implementations, the sounds may be received through recording devices, analysis of played material, analysis of digital source material, and/or generation of expected background noise characteristics (as in the scenario of assuming a noise level in a vehicle based on speed of travel).

Depending on the implementation chosen, the process of FIG. 3 may be performed for various lengths of audio signal and background noise. For the sake of illustration, the processes described herein are performed with reference to a "block" of audio, said block comprising multiple audio samples. In one implementation, a block of samples comprises all samples for a given period of time and includes samples from all frequencies represented in the audio signal for that time period. In alternative implementations, the block may represent less than all frequencies in the audio signal, or may represent larger or smaller periods of time. In yet another implementation, the processes performed herein may be performed on multiple blocks at once, either serially or in parallel.

Next, at block 320, the system performs a loudness approximation for the block of audio signal. Next, at block 330, the system performs a second loudness approximation, this time for the block of audio signal in the presence of the one or more extraneous sounds determined earlier. Particular details of implementations of performing approximation will be discussed below with reference to FIG. 4.

Next, at block, 340, the system applies gain to the audio signal to compensate for the one or more extraneous sounds. Various implementations of this process are described in greater detail below with reference to FIG. 9. Finally, at block, 350, the system played the audio signal, as modified by the application of gain from block 340 and the process ends.

Figure 4:
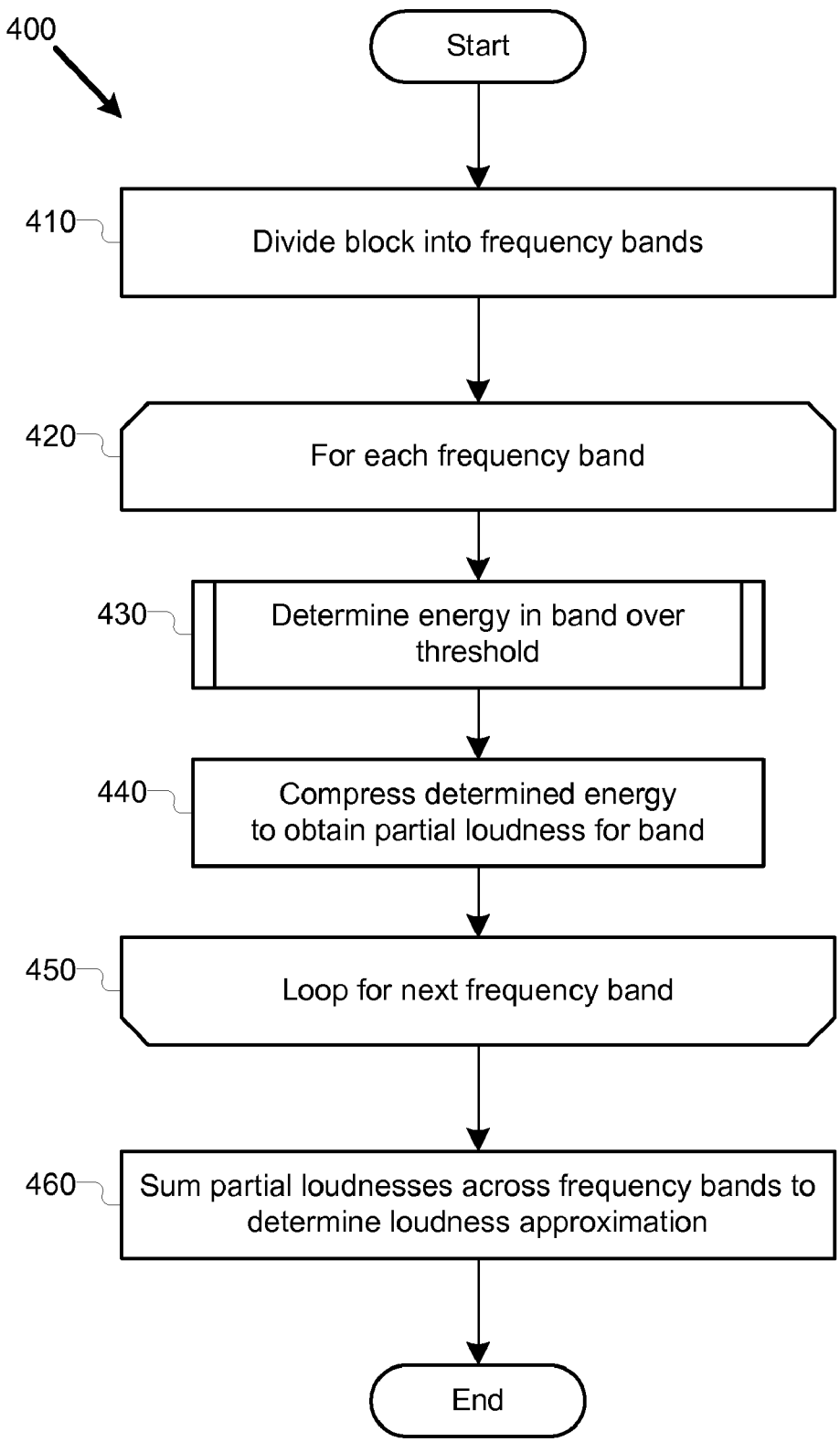
FIG. 4 is a flowchart illustrating an example process performed by the system of FIG. 1 for performing a loudness approximation for an audio signal.

FIG. 4 is a flowchart of an example process 400 performed by the loudness-based compensation system 100 for approximating loudness. In various implementations, the illustrated process blocks may be merged, divided into sub-blocks, or omitted. In various implementations or utilizations, process 400 may be performed for either an audio signal alone, or for an audio signal in the presence of a background noise. Indeed, the process of FIG. 3, and in particular the processes of blocks 320 and 330, rely upon performing process 400 twice for each block in order to gain loudness information with and without background noise.

The process begins at block 410, where the block to be analyzed is divided into frequency bands. As discussed above, these bands are, in one implementation, chosen to model human perception of loudness and such that sounds combined within the bands are compressed while sounds added from different bands are not perceived as compressed. In another implementation, no actual division of the block takes place, but rather data from each band is retrieved from the block when that band is analyzed. Additionally, in some implementations, fewer than every band available is analyzed, either because the audio signal does not contain information in the band, the band is outside of the perceivable range of the listener, or to allow for greater efficiency of computation.

Next, the process begins a loop for each frequency band in the block at loop block 420. Within the loop, the process continues at block 430 to determine the energy contained within the band over a threshold. This process is described in greater detail below with reference to FIG. 5. Next, at block 440, the energy in the band is compressed to approximate the perceptual compression discussed above with respect to FIG. 2; this is called, in one implementation, the "partial loudness" for that frequency band.

In one implementation, compression to determine partial loudness is performed by raising the amount of energy in the band to the $$\frac{1}{3.5}$$

power. In another implementation, the system compresses the energy using the power, rather than the $$\frac{1}{4}$$

$$\frac{1}{3.5}$$

power. While this choice of compression parameter may map less precisely to typical human loudness perception, it is more efficient in some systems because the identity $$x^{\frac{1}{4}} = (x^{\frac{1}{2}})^{\frac{1}{2}} = \sqrt{\sqrt{x}}$$

means the calculation can be performed using square root algorithms. In some systems, square roots are optimized and are thus computationally more efficient to compute than an arbitrary fractional power, such as $$\frac{1}{3.5}.$$

Alternatively implementations may utilize different powers depending on system or listener contexts.

Next, at loop block 440, the loop continues for the next frequency band in the audio block. Finally, at block 450, the partial loudness for each frequency band is summed across all the bands in order to determine a loudness approximation for the totality of the bands. Thus, through process 400, energies for the various frequency bands are compressed into partial loudnesses and then added together to obtain a single loudness metric for the bands. It is this implementation of the reality of loudness perception that allows the processes described herein to accurately compensate for background noise. The process of FIG. 4 then ends.

In some implementations, not illustrated, the process of FIG. 4 may be modified to apply to particular contexts or playback scenarios. One particular context which may be taken into account is the handling of different channels, such as, for example, a left and right channel, depending on the playback scenario. For example, one implementation of the loudness-based compensation system to be used with loudspeakers will determine the energy over threshold for a band in each channel, and then add those together before compression to obtain a partial loudness measure for the band over both channels. These partial loudnesses can then be added together to obtain a loudness approximation for both speakers. This implementation takes advantage of the fact that, in a typical loudspeaker/listener scenario, each speaker is heard by both of a listener's ears.

Contrasting this is one implementation of the loudness-based compensation system to be used with headphones, which typically do not have any cross-feed between channels, and thus have each channel heard by only one ear. In such an implementation, the system compresses the energy over threshold in each band separately for each channel, giving a series of partial loudnesses for each channel. These are then summed to create a loudness approximation for each channel, and then the channels are summed to create an approximation for both channels.

Figure 5:
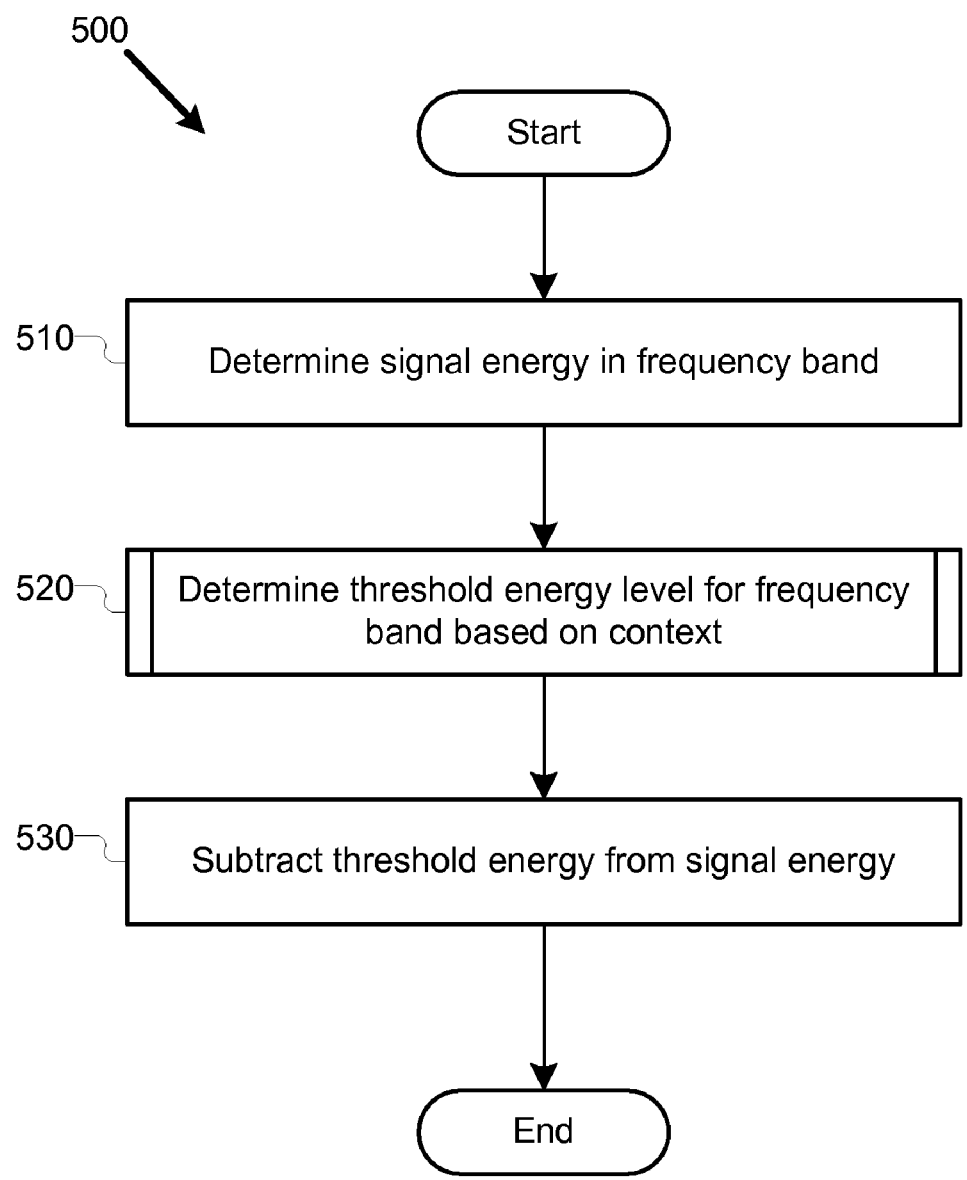
FIG. 5 is a flowchart illustrating an example process performed by the system of FIG. 1 for determining energy in a frequency band.

FIG. 5 is a flowchart of an example process 500 performed by the loudness-based compensation system 100 for determining the energy in a frequency band. In various implementations, the illustrated process blocks may be merged, divided into sub-blocks, or omitted. In one implementation, the process of FIG. 5 is performed as the process of block 430 of FIG. 4 and is performed for each frequency band analyzed in the audio block. The process beings at block 510, where the system determines the signal energy within the currently-analyzed frequency band. In one implementation this signal energy is synonymous with the intensity of all of the audio samples from the audio signal for the block within that band.

Next, at block 520, the system determines the threshold to be observed for the frequency band, based on the context in which the loudness is being approximated for the block. This loudness is based on the model of human hearing perception used in the system as well as (possibly) the level of background noise within the currently-analyzed frequency band, depending on whether the loudness is being approximated with or without the presence of background noise. Thus, in one implementation, a major difference in approximating loudness for a block with or without the presence of background noise is determination of the threshold for each band. Particular implementation details for determining a threshold for a frequency band are discussed below with reference to FIG. 7. Finally, at block 530, the system determines the amount of energy within the band over the determined threshold by subtracting the threshold energy from the frequency band and the process ends.

Figure 6:
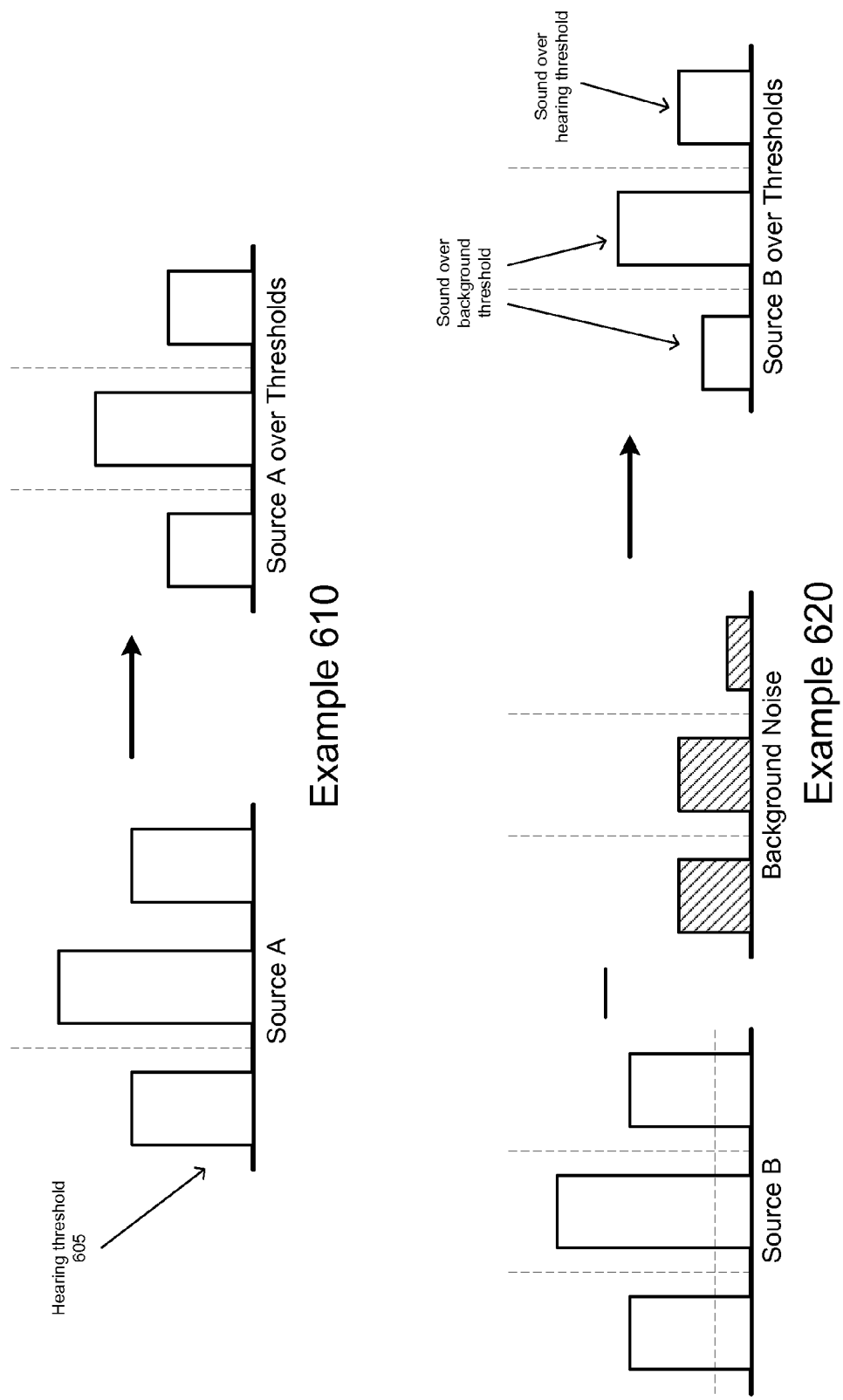
FIG. 6 is a block diagram illustrating an example of audible thresholds for an audio signal with an without the presence of a background noise.

FIG. 6 is a pair of Examples 610 and 620 which illustrate, in a general way, the differences in how thresholds are taken into account in the techniques described herein. It should be noted that, similarly to the examples of FIG. 2, the bars and frequency bands shown in the examples of FIG. 6 represent only general values and are for illustrative purposes only; these examples are not created with regard to any particular sounds, intensities, or frequencies.

Example 610 shows a representation of sound intensity in three frequency bands for a Source A. Additionally, Example 610 shows a threshold of hearing 605, represented by a dotted line. This threshold is determined, in one implementation, as a minimum audible intensity for a given frequency band for an average listener. It should be noted that, while one constant threshold is illustrated for the sake of simplicity, in a typical implementation different thresholds will be utilized for different frequency bands. As Example 610 illustrates, in one implementation of approximating loudness, the system can simply subtract the hearing threshold from the intensity in each band to arrive at an intensity over the hearing threshold for each band. As will be described below, these intensities can then be used to approximate a loudness metric for the source.

Example 620 illustrates the impact of background noise in approximating loudness for a source. In Example 620, the Source B has a similar profile to Source A, but its loudness is being determined in the presence of a background noise. It is important to note that, for two of the three frequency bands represented, the background noise is of a greater intensity than the hearing threshold. In this scenario, to determine the intensities in each band in the presence of a background noise, the larger of either the background intensity or the hearing threshold is subtracted from the source intensity. Thus, in Example 620, in the first two illustrated frequency bands, the background intensities are subtracted from the intensities in the audio source to determine the intensity in the presence of the background noise. However, in the third band, because the background noise intensity is so low, the hearing threshold is subtracted instead. It may be noted that this makes an intuitive sense, as a background noise intensity that is lower than a person's general hearing threshold is unlikely to interfere with that person's listening to an audio signal.

Figure 7:
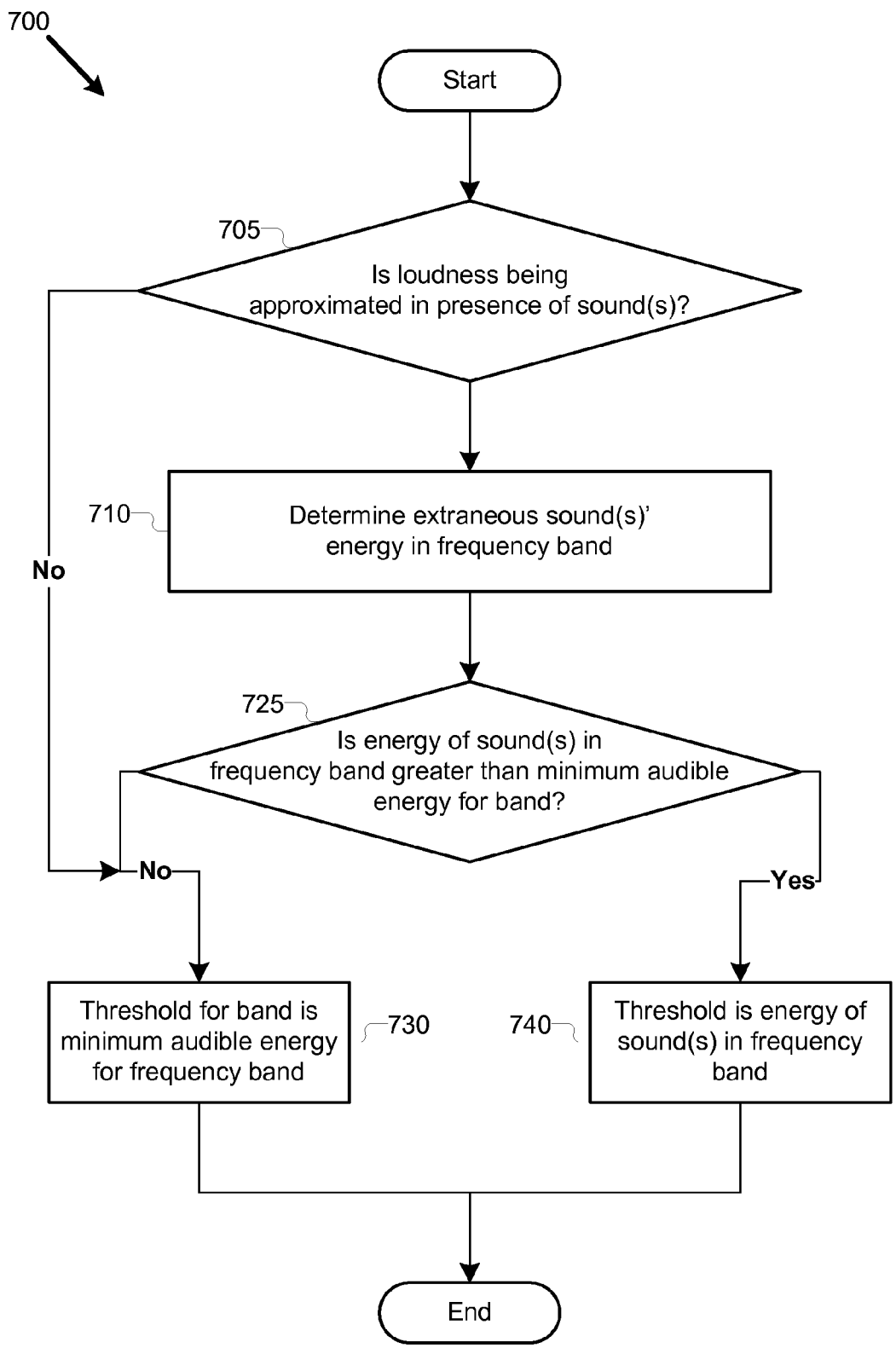
FIG. 7 is a flowchart illustrating an example process performed by the system of FIG. 1 for determining a threshold in a frequency band.

FIG. 7 is a flowchart of an example process 700 performed by the loudness-based compensation system 100 for determining the threshold for a frequency band. In various implementations, the illustrated process blocks may be merged, divided into sub-blocks, or omitted. In one implementation, process 700 describes the process of block 520 of FIG. 5.

The process begins at decision block 705, where the system determines if loudness is being approximated in the presence of extraneous sounds or not. This determination is part of the reason the loudness approximation processes described herein can be used in and out of the presence of background noise. If the system determines the loudness is not being approximated in the presence of other sounds, the process jumps to block 730, where the system determines the threshold for the band as the minimum audible energy, or intensity, for the band, and the process ends.

If, however, at decision block 705 the system determines that it is determining loudness in the presence of extraneous sounds, the process continues to block 710. At block 710, the system determines the extraneous sound's (or sounds') energy in the frequency band. Next, at decision block 725, the system determines if the energy of the extraneous sound (or sounds) in the band is greater than the minimum audible energy in the band. If not, then the system goes to block 730. As above, at block 730 the system determines the threshold for the band as the minimum audible energy for the band, and the process ends. If, however, at decision block 725, the system determines that the energy of the sound or sounds is indeed greater than the minimum audible energy, then the system continues to block 740 where it determines that the threshold for the band is the energy of the sound (or sounds) in the band. The process then concludes.

Figure 8:
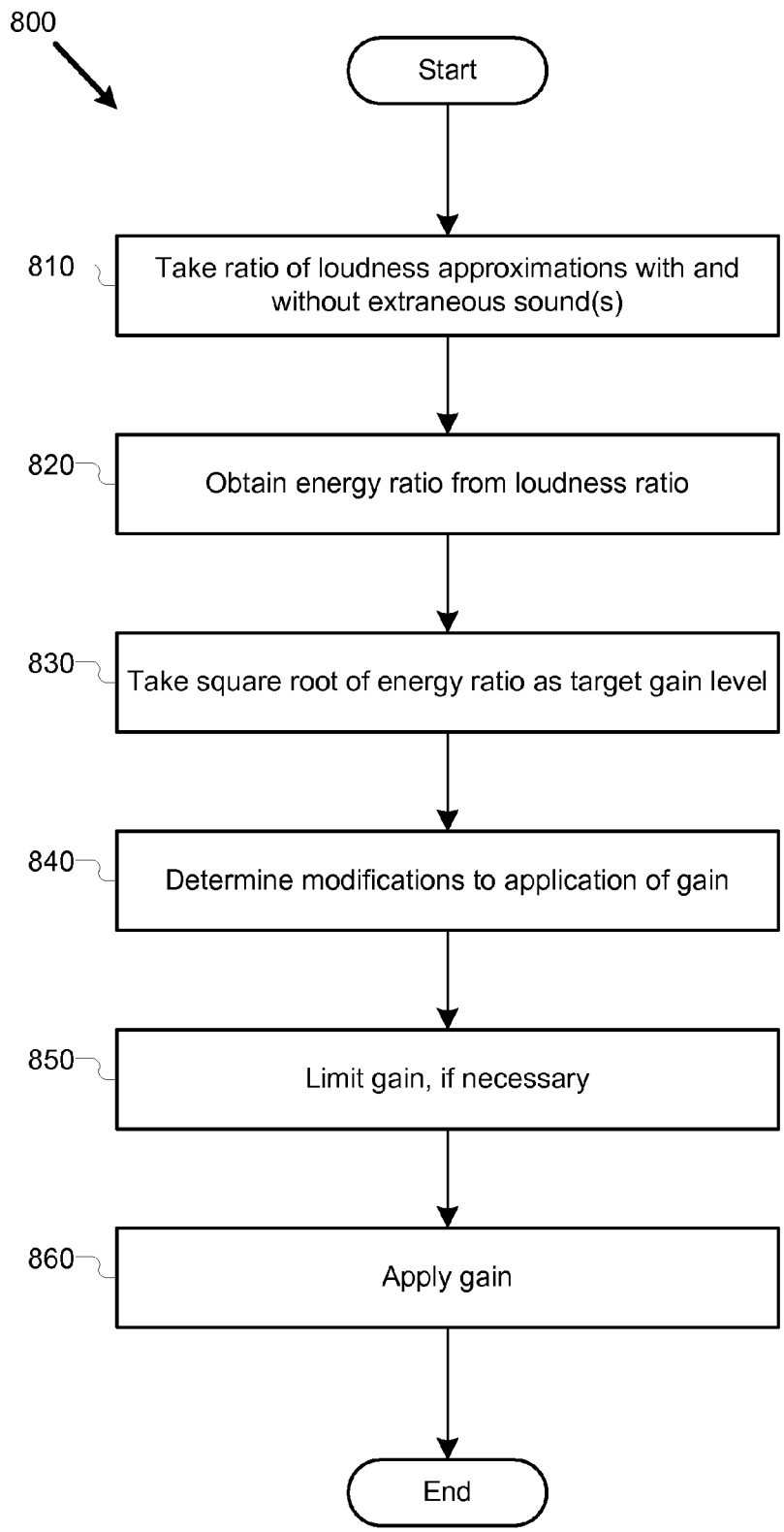
FIG. 8 is a flowchart illustrating an example process performed by the system of FIG. 1 for applying gain to an audio signal for loudness-based compensation.

FIG. 8 is a flowchart of an example process 800 performed by the loudness-based compensation system 100 for determining and applying a proper level of gain to perform the loudness-based compensation described herein. In various implementations, the illustrated process blocks may be merged, divided into sub-blocks, or omitted. In one implementation, the process of FIG. 8 serves at the process of block 340 and is performed after the loudness approximations have been received for a block both with and without background noise.

The process begins at block 810, where the system takes a ratio of the loudness approximation for the audio signal without extraneous sounds to the approximation for the signal with extraneous sounds. This is done so that the system can determine a comparison of the actual loudness of the audio signal versus the intended loudness of the signal. Next, at block 820, the system obtains an equivalent energy ratio from this loudness ratio. In one implementation, the system does this by raising the loudness ratio to a power equal to the inverse of the compression parameter used at block 440 of FIG. 4. Thus, in one implementation, the system raises the loudness ratio to the 3.5 power, if the compression was performed by using a $$\frac{1}{3.5}$$

compression parameter, or the 4th power, if the compression was performed using a $$\frac{1}{4}$$

compression parameter.

Next, at block 830, the system takes the square root of the energy ratio, providing an amplitude ratio. This value is used as a target amplitude gain to be applied to the signal. It is this value that is, in one implementation, input into the gain application module 140 so that gain levels can be determined for the block in order to effect loudness-based compensation. It should be noted that, in an implementation based on a compression parameter of $$\frac{1}{4},$$

the processes of block 820 and 830 result in an amplitude ratio equal to the loudness ratio squared. Thus, in such an implementation, the simplicity of generating an amplitude ratio provides additional efficiencies.

Next, at block 850, the gain is limited, if necessary. In one implementation, this is performed by the gain application module 140. Some implementations, rather than applying the gain directly, will instead apply the gain slowly over the time of the block, or part of the time of the block, in order that listeners are not bothered by the effect of the gain. Thus, the level of gain may be raised over time, rather than applying the full level to the entire block. In another implementation, a reduction in gain is applied immediately, while increases in gain are applied over time. In yet another implementation, this limiting is performed though the use of a linear window technique.

In another implementation, the system limits the application of gain based on the peak signal of the audio source. Thus, if the system has an indication of a peak signal level, the system will not fully apply a gain level if that gain level will cause the amplified block to exceed the peak level. In another implementation, the system maintains a maximum level of gain, beyond which it will not increase a signal, regardless of the level of the amplified signal. Finally, at block 860, the gain is applied to the audio signal for the block in order to perform the actual compensation.

3. Computing Environment

The above loudness-based compensation techniques can be performed on any of a variety of computing devices. The techniques can be implemented in hardware circuitry, as well as in software executing within a computer or other computing environment, such as shown in FIG. 9.

Figure 9:
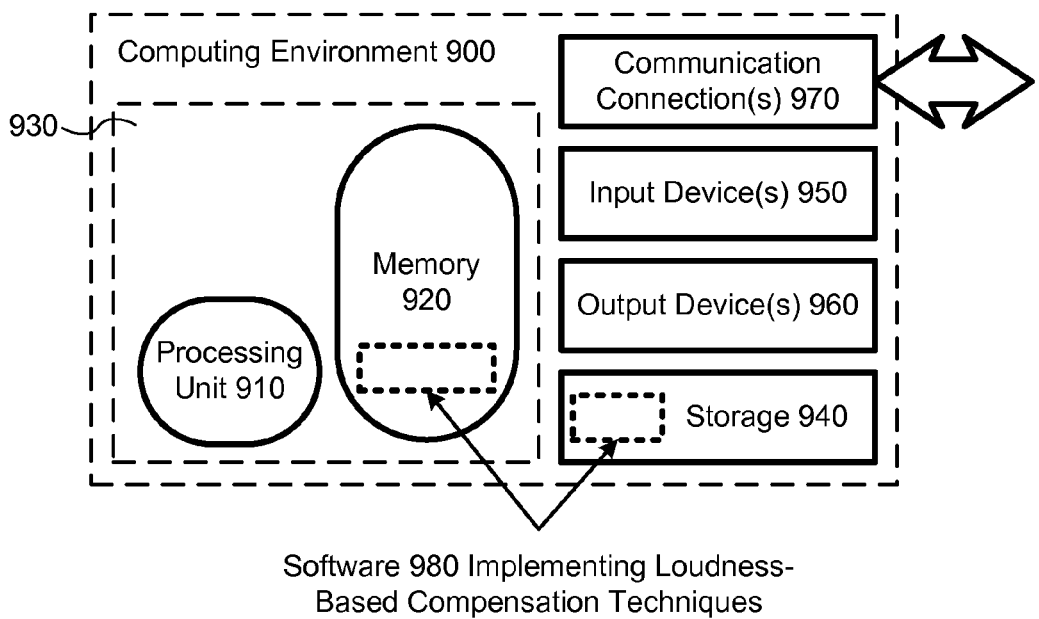
FIG. 9 is a block diagram illustrating an example computing environment for performing the loudness-based compensation techniques described herein.

FIG. 9 illustrates a generalized example of a suitable computing environment 900 in which described embodiments may be implemented. The computing environment 900 is not intended to suggest any limitation as to scope of use or functionality of the invention, as the present invention may be implemented in diverse general-purpose or special-purpose computing environments.

With reference to FIG. 9, the computing environment 900 includes at least one processing unit 910 and memory 920. In FIG. 9, this most basic configuration 930 is included within a dashed line. The processing unit 910 executes computer-executable instructions and may be a real or a virtual processor. In a multi-processing system, multiple processing units execute computer-executable instructions to increase processing power. The memory 920 may be volatile memory (e.g., registers, cache, RAM), non-volatile memory (e.g., ROM, EEPROM, flash memory, etc.), or some combination of the two. The memory 920 stores software 980 implementing the described techniques. The GPU 915 may be integrated with the processing unit 910 on a single board or may be contained separately.

A computing environment may have additional features. For example, the computing environment 900 includes storage 940, one or more input devices 950, one or more output devices 960, and one or more communication connections 970. An interconnection mechanism (not shown) such as a bus, controller, or network interconnects the components of the computing environment 900. Typically, operating system software (not shown) provides an operating environment for other software executing in the computing environment 900, and coordinates activities of the components of the computing environment 900.

The storage 940 may be removable or non-removable, and includes magnetic disks, magnetic tapes or cassettes, CD-ROMs, CD-RWs, DVDs, or any other medium which can be used to store information and which can be accessed within the computing environment 900. The storage 940 stores instructions for the software 980 implementing the described loudness-based compensation techniques.

The input device(s) 950 may be a touch input device such as a keyboard, mouse, pen, or trackball, a voice input device, a scanning device, or another device that provides input to the computing environment 900. For audio, the input device(s) 950 may be a sound card or similar device that accepts audio input in analog or digital form, or a CD-ROM reader that provides audio samples to the computing environment. The output device(s) 960 may be a display, printer, speaker, CD-writer, or another device that provides output from the computing environment 900.

The communication connection(s) 970 enable communication over a communication medium to another computing entity. The communication medium conveys information such as computer-executable instructions, compressed audio or video information, or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

The techniques described herein can be described in the general context of computer-readable media. Computer-readable media are any available media that can be accessed within a computing environment. By way of example, and not limitation, with the computing environment 900, computer-readable media include memory 920, storage 940, and combinations of any of the above.

The techniques herein can be described in the general context of computer-executable instructions, such as those included in program modules, being executed in a computing environment on a target real or virtual processor. Generally, program modules include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing environment.

For the sake of presentation, the detailed description uses terms like "calculate," "generate," "approximate," and "determine," to describe computer operations in a computing environment. These terms are high-level abstractions for operations performed by a computer, and should not be confused with acts performed by a human being. The actual computer operations corresponding to these terms vary depending on implementation.

In view of the many possible variations of the subject matter described herein, we claim as our invention all such embodiments as may come within the scope of the following claims and equivalents thereto.

I claim:

1. A method of adjusting an audio signal comprising multiple frequency bands to improve perception of the signal in the presence of a sound other than the audio signal, the method comprising:
    performing a first loudness approximation on a plurality of frequency bands of the audio signal, resulting in a first combined loudness measurement, wherein the first loudness approximation is based on a perceptual compression in at least one of the plurality of frequency bands to obtain an associated partial loudness;
    performing a second loudness approximation on the plurality of frequency bands of the audio signal in the presence of the sound other than the audio signal, resulting in a second combined loudness approximation measurement, wherein the second loudness approximation is based on a perceptual compression in at least one of the plurality of frequency bands to obtain an associated partial loudness;
    applying gain to the audio signal based on a comparison of the first and second combined loudness measurements; and
    playing the modified audio signal.

2. The method of claim 1, wherein the combined loudness measurements are other than direct measurements of the amount of energy in the audio signal.

3. The method of claim 2, wherein performing a loudness approximation comprises performing an invertible loudness transformation function on each of the plurality of frequency bands.

4. The method of claim 3, wherein performing a loudness approximation comprises:
    for each of the plurality of frequency bands:
    measuring the amount of energy present in the audio signal;
    subtracting a threshold energy from the energy measured in the audio signal;
    perceptually compressing the remaining energy for each band; and
    summing the compressed energies to obtain a combined loudness measurement.

5. The method of claim 4, wherein the plurality of frequency bands are selected to model perception of sound by a human ear.

6. The method of claim 4, wherein, when performing the first loudness approximation, the threshold energy for a frequency band is based on a minimum audible energy for the frequency band.

7. The method of claim 4, wherein, when performing the second loudness approximation in the presence of the sound other than the audio signal, the threshold energy for a frequency band is based on both energy in the frequency band for the sound other than the audio signal and a minimum audible energy for the frequency band.

8. The method of claim 4, wherein compressing the remaining energy for a band comprises performing a power-law transformation on the remaining energy.

9. The method of claim 1, wherein applying gain to the audio signal comprises applying a gain based in part on a ratio of the first combined loudness measurement to the second combined loudness measurement.

10. The method of claim 9, wherein applying gain to the audio signal further comprises modifying applied gain over time in order to reduce perception of the application of gain to a listener.

11. The method of claim 1, wherein the first and second combined loudness measurements are taken with respect to a plurality of audio samples of the audio signal and wherein performing the second loudness approximation comprises taking one or more samples of the sound other than the audio signal.

12. The method of claim 11, wherein:
the sound other than the audio measurement is background noise; and
taking one or more samples of the sound other than the audio signal comprises recording the background noise during playback of the audio signal.

13. The method of claim 1, wherein performing a first and second loudness approximation comprises different calculations when the audio signal is heard through a personal listening device than when the audio signal is heard through a loudspeaker.

14. The method of claim 1, wherein the perceptual compression is based on applying a 1/3.5 or 1/4 power law compression.

15. A method of reducing perception of background noise when playing an audio signal, the method comprising:
analyzing a block of samples from a plurality of frequency bands of the audio signal to determine a combined loudness parameter for the block of samples without the background noise, wherein the loudness parameter is based on perceptual compression in at least one of the plurality of frequency bands;
analyzing the block of samples from a plurality of frequency bands of the audio signal along with samples from the same frequency bands of the background noise to determine a combined loudness parameter for the block of samples in the presence of the background noise wherein the loudness parameter is based on perceptual compression in at least one of the plurality of frequency bands;
determining a level of gain to apply to the block of samples to correct for reduced perceived loudness of the audio signal in the presence of the background noise; and
amplifying the block according to the determined level of gain.

16. The method of claim 15, wherein the combined loudness parameters represent perceived audible strength of the block of samples.

17. The method of claim 16, wherein analyzing a block of samples comprises:
for each frequency band of the plurality of frequency bands:
determining an intensity of the block of samples in that frequency band; and
determining a difference in intensity over a baseline level; and
combining differences in intensity over baseline levels for each frequency band out of the frequency bands; and
wherein the baseline level for a frequency band in the presence of background noise is based on intensity of the background noise in that frequency band.

18. The method of claim 15, wherein the perceptual compression is based on applying a 1/3.5 or 1/4 power law compression.

19. One or more computer-readable media containing instructions which, when executed by a computer cause the computer to perform a method of reducing perception of background noise when playing an audio signal, the method comprising:
analyzing a block of samples from a plurality of frequency bands of the audio signal to determine a combined perceptual loudness measurement for the block of samples without the background noise;
analyzing the block of samples from a plurality of frequency bands of the audio signal along with samples from the same frequency bands of the background noise to determine a combined perceptual loudness measurement for the block of samples in the presence of the background noise;
determining a level of gain to apply to the block of samples to correct for reduced perceived loudness of the audio signal in the presence of the background noise; and
amplifying the block according to the determined level of gain.

20. The computer-readable media of claim 19, wherein the method further comprises receiving an audio signal for the background noise from a microphone.

21. The computer-readable media of claim 19, wherein determining the level of gain to apply to the block comprises determining levels that change with time such that perception of gain changes is reduced to a listener.

22. The computer-readable media of claim 20, wherein determining levels that change with time comprises determining levels that increase over time in order to avoid a sharp jump in gain level.

23. The method of claim 19, further comprising applying a 1/3.5 or 1/4 power law to obtain the combined perceptual loudnesses.

* * * * *